United States Patent [19]

Hatano et al.

[11] Patent Number: 5,617,438
[45] Date of Patent: Apr. 1, 1997

[54] SEMICONDUCTOR LASER AND METHOD FOR MANUFACTURING THE SAME

[75] Inventors: Ako Hatano, Tokyo; Yasuo Ohba, Yokohama, both of Japan

[73] Assignee: Kabushiki Kaisha Toshiba, Kawasaki, Japan

[21] Appl. No.: 567,982

[22] Filed: Dec. 11, 1995

[30] Foreign Application Priority Data

Dec. 19, 1994 [JP] Japan .................. 6-314901

[51] Int. Cl.$^6$ ........................................ H01S 3/19
[52] U.S. Cl. .................. 372/45; 257/101; 257/102
[58] Field of Search ................... 372/45, 46, 43; 257/101, 102

[56] References Cited

FOREIGN PATENT DOCUMENTS 58-56329  4/1983  Japan .

OTHER PUBLICATIONS

Shen et al., "Rapid Isothermal Processing of Si+ /P+ and Mg+/P+ Co–Implantations into InP", IEEE Transactions On Electron Devices, vol. 39, No. 1, pp. 209–211.

Shuji Nakamura, et al. "Thermal Annealing Effects On P–Type Mg–Doped GaN Films", *Japanese Journal of Applied Physics*, vol. 31, 1992, pp. L139–L142. (no month available).

Shuji Nakamura, et al. "Hole Compensation Mechanism Of P–Type GaN Films", *Japanese Journal of Applied Physics*, vol. 31, 1992, pp. 1258–1266. (no month available).

Shuji Nakamura, et al. "Candela–Class High–Brightness InGaN/AlGaN Double–Heterostructure Blue–Light–Emitting Diodes", *Applied Physics Letters*, vol. 64, No. 13, Mar. 28, 1994, pp. 1687–1689.

*Primary Examiner*—Rodney B. Bovernick
*Assistant Examiner*—Luong-Quyen T. Phan
*Attorney, Agent, or Firm*—Oblon, Spivak, McClelland, Maier & Neustadt, P.C.

[57] ABSTRACT

A semiconductor laser having an oscillation wavelength of not more than 450 nm comprises a substrate, a lower cladding layer containing a III-V Group compound semiconductor as a main component formed on the substrate, an active layer containing the III-V Group compound semiconductor as a main component formed on the lower cladding layer and an upper p-type cladding layer containing III-V Group compound semiconductor as a main component. Mg and Si are contained in the upper p-type cladding layer. A GaN series compound semiconductor is preferably used as the III-V Group compound semiconductor and the upper cladding layer contains preferably not less than $5\times10^{18}/cm^3$ of Si.

8 Claims, 2 Drawing Sheets

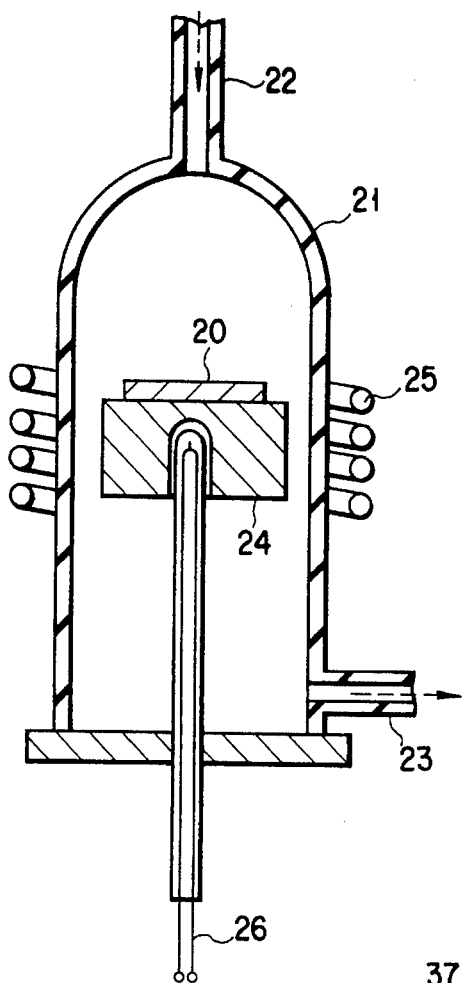
F I G. 3
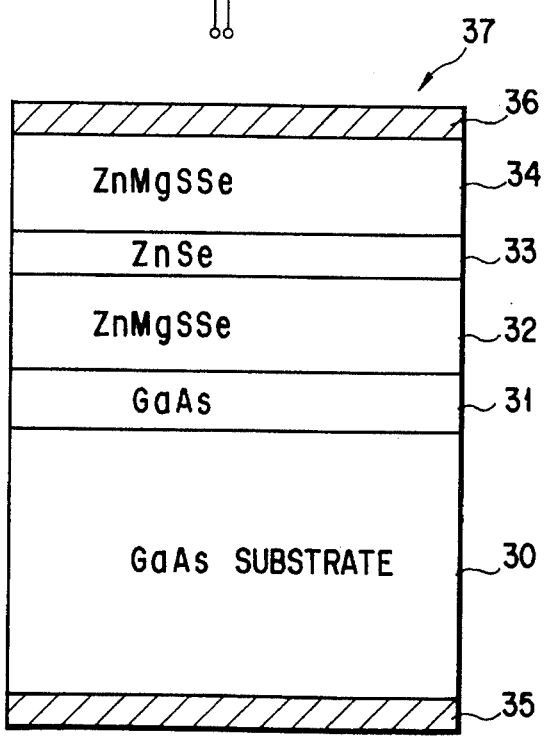
F I G. 4

SEMICONDUCTOR LASER AND METHOD FOR MANUFACTURING THE SAME

BACKGROUND OF THE INVENTION

1. Field of the Invention

The present invention relates to a semiconductor laser and a method for manufacturing the same and, in particular, to a semiconductor laser having a compound semiconductor layer using magnesium (Mg) as a dopant or a constituent element.

2. Description of the Related Art

In recent years, a III-V Group compound semiconductor, such as GaAs, InP and GaInAlP, can be grown, by a metal organic chemical vapor deposition (MOCVD), with better controllability and has been extensively utilized as a constituent component for a semiconductor laser and light emitting diode.

In the MOCVD method, Zn is generally used as a p-type dopant for the III-V Group compound semiconductor and, being used as a p-type dopant for the GaAs, exhibits a substantially good doping characteristic. If, however, Zn is used as a dopant for a P-containing III-V Group compound semiconductor, such as InP and GaInAlP, the percentage of Zn incorporated into the compound semiconductor is low and it has been difficult to dope the Zn in a desired amount. Further, the activation degree of the Zn is low and the diffusion of it in a layer is fast, resulting in poor controllability.

The elements Be and Mg for example may be considered as a p-type dopant in place of Zn. The element Be exhibits a good characteristic as a p-type dopant in a molecular beam epitaxy (MBE) method. However, the organic Be compound is strongly toxic and it is very difficult to use it as the dopant in the MOCVD method. On the other hand, a straight chain type organometal compound of Mg, such as dimethylmagnesium and diethylmagnesium, is not toxic in nature, but very strong in its self-association and never occurs in single form. For this reason, the Mg-containing straight chain type organometal compound is not suitable as a doping agent.

Recently, biscyclopentadienylmagnesium (Cp$_2$Mg) relatively high in vapor pressure has been used as a Mg-doping material. However, the material Cp$_2$Mg is deposited as a residual one in a crystal growing apparatus and exhibits a memory effect so that the doping control is very difficult. In spite of the fact that a three-orders-of-magnitude-greater concentration variation is required in a 0.1 μm film thickness for a double heterostructure (DH) laser device, such a sharp concentration variation cannot be ensured at the present time. In order to enhance the vapor pressure, the methyl group-attached cyclopenta ring type material "bismethylcyclopentadienylmagnesium" [(CH$_3$)Cp$_2$Mg] is known as one example of a dopant and, even in this case, no sharp Mg-concentration variation is obtained at a doped-to-undoped interface.

In order to reduce a resistivity of a predetermined semiconductor layer, more amount of Mg has to be doped as a p-type dopant. In order to obtain a resistance value of, for example, about 0.5 Ω·cm to 10 10$^6$·cm, the Mg has to doped at a concentration amount of about 5×10$^{18}$/cm$^3$ to 5×10$^{19}$/cm$^3$. In the case where more amount of Mg is so doped, the laser performance is lowered and, for the case of a semiconductor laser having an active layer as narrow as below 5 nm in thickness in particular, a greater adverse influence is exerted over an operating current.

There are sometimes the cases where the Mg is employed not only as a p-type dopant for the III-V Group compound semiconductor but also as one of the constituent element of the compound semiconductor layer of II-VI Group compound semiconductors, etc. Even in this case, it has been difficult to effect high accurate control of an Mg composition, the reason of which is the same as set out above.

In order to incorporate Mg into the II-VI Group compound semiconductor, an amount of Mg is not less than 10% and preferable in terms of decrease in an operating current and shortening a wavelength. For a semiconductor laser principally of a II-VI Group compound semiconductor containing such an amount of Mg, it has been difficult to obtain adequate reliability. A semiconductor laser, having an active layer as thin as less than 5 nm in particular, is markedly lower in its performance, such as increasing an operating current.

In this way, the simple alkyl compounds of Mg, such as dimethylmagnesium and diethylmagnesium, are lower in vapor pressure and not suitable as an Mg feed in the growth of a compound semiconductor layer by the MOCVD method. For a Mg compound including a cyclopenta ring, it has been difficult to control the Mg composition, or Mg doping amount, in a compound semiconductor layer because a high memory effect is involved.

In the case where the Mg doping amount is increased so as to lower the resistance of a p-type cladding layer, a semiconductor laser principally of a Mg-doped III-V group semiconductor is lower in the characteristics, such as an efficiency of an emitting layer and, in the worst case, the operation is not possible. Even with a semiconductor laser principally of a II-VI Group compound semiconductor containing Mg as one of its constituent elements, if more Mg is introduced into a cladding layer, a similar problem arises therefrom.

In either case, if the Mg amount is increased in a semiconductor layer, the semiconductor laser is lower in its characteristics, thus failing to obtain adequate reliability.

SUMMARY OF THE INVENTION

It is accordingly the object of the present invention to provide a semiconductor laser principally of a III-V Group compound semiconductor having a p-type doping layer of a desired resistance and exhibiting an excellent performance.

Another object of the present invention is to provide a semiconductor laser principally of a II-VI Group compound semiconductor containing an adequate amount of Mg in upper and lower cladding layers and ensuring high reliability.

According to one aspect of the present invention, there is provided a semiconductor laser having an oscillation wavelength of not more than 450 nm, comprising: a substrate; a lower cladding layer formed on or over the substrate and containing a III-V Group compound semiconductor as a main component; an active layer formed on the lower cladding layer and containing the III-V Group semiconductor as a main component; and an upper p-type cladding layer formed on the active layer and containing the III-V Group semiconductor as a main component, wherein Mg and Si are included in the upper p-type cladding layer.

According to another aspect of the present invention, there is provided a method for manufacturing a semiconductor laser comprising the steps of: forming a lower cladding layer containing a III-V Group compound semiconductor as a main component on or over a substrate;

forming an active layer containing a III-V compound semiconductor as a main component on the lower cladding layer; and forming an upper p-type cladding layer containing the III-V Group compound semiconductor as a main component on the active layer; wherein, as a p-dopant source gas for forming the upper cladding layer, use is made of an Me$_3$Si-group-containing organic Mg compound.

According to another aspect of the present invention, there is provided a semiconductor laser comprising: a substrate; a lower cladding layer formed on or over the substrate and containing an Mg-containing II-VI Group compound semiconductor as a main component; an active layer formed on the lower cladding layer and containing a II-VI Group compound semiconductor as a main component; and an upper p-type cladding layer formed on the active layer and containing an Mg-containing II-VI Group compound semiconductor as a main component; wherein Si is included in at least one of an active layer side of the lower cladding layer and an active layer side of the upper p-type cladding layer.

According to another aspect of the present invention, there is provided a method for manufacturing a semiconductor laser, comprising the steps of: forming a lower cladding layer containing an Mg-containing II-VI Group compound semiconductor as a main component on or over a substrate; forming an active layer containing a II-VI Group compound semiconductor as a main component on the lower cladding layer; and forming an upper p-type cladding layer comprising the Mg-containing II-VI Group compound semiconductor as a main component on the active layer, wherein, as an Mg source gas for forming the upper p-type cladding layer and lower cladding layer, use is made of an Me$_3$Si-group-containing organic Mg compound.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 3 is a diagrammatic view showing a crystal growing apparatus as used in the manufacture of the embodiment; and FIG. 4 is a cross-sectional view showing a semiconductor laser according to another embodiment of the present invention.

DETAILED DESCRIPTION OF THE PREFERRED EMBODIMENTS

Figure 1:
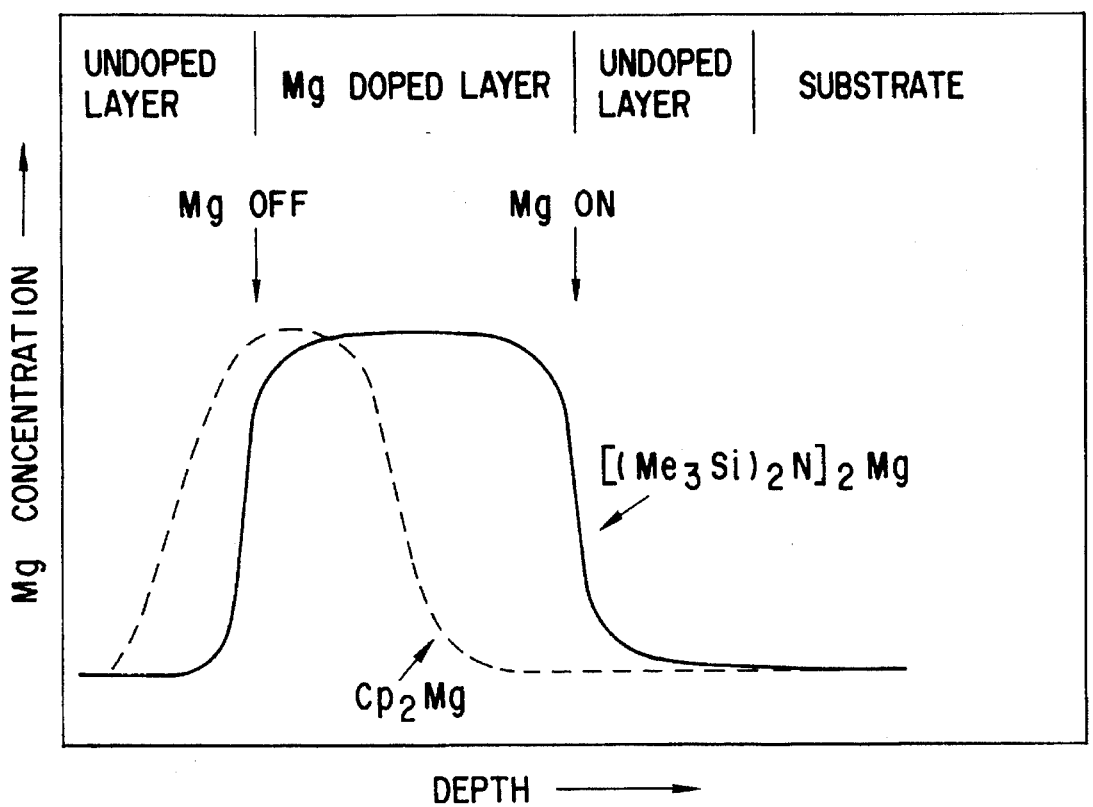
FIG. 1 is a view showing a relation of a Mg concentration profile to a depth direction when Mg is doped into GaN layer.

The inventors have conceived that lowered reliability caused upon the doping of a greater quantity of Mg into a III-V compound semiconductor layer is due to the diffusion of Mg into an associated layer and no formation of any sharp interface between a doped and an undoped layer. As a result of strenuous researches into the causes they have found it possible to suppress the diffusion of the Mg in the presence of Si in the doped layer. That is, in order to reduce the resistance of a specific semiconductor layer to nearly a predetermined extent, it is required that an amount of Mg contained in that layer be set to be of the order of not less than $10^{18}$/cm$^3$. In this case, the Mg is diffused across an interface with an adjacent layer. For this reason, no sharp interface is created between the doped and the undoped layer, resulting in lowered reliability being caused on a semiconductor laser.

In the semiconductor laser of the present invention, Si together with Mg is present in a p-doped layer so that the diffusion of the Mg in the p-doped layer can be suppressed. Particularly by incorporating the amount of Si corresponding to that of Mg into the doped layer it is possible to more effectively suppress the diffusion of the Mg. Where not less than $5\times10^{18}$/cm$^3$ of Si is contained in a III-V Group compound semiconductor layer, even if not less than $5\times10^{18}$/cm$^3$ of Mg is contained in this layer, the diffusion of the Mg into a neighboring layer is suppressed. That is, a desired resistance is obtained by doping a larger amount of Mg and, by suppressing the diffusion of the Mg by the Si, it is possible to ensure a sharp interface between the doped and the undoped layer. The semiconductor laser having such semiconductor component as main constituents can prevent any lowered reliability.

The inventors have interpreted the lowering of the reliability of the semiconductor laser caused when a greater amount of Mg is contained as one of those constituent element of a II-VI Group compound semiconductor layer, as follows. That is, distortion is liable to be produced at an interface between the II-VI compound semiconductor layer containing a greater amount of Mg and a II-VI Group compound semiconductor layer situated adjacent the layer immediately above and not containing the Mg. As a result, lattice defects such as dislocation is produced, thus lowering the reliability of the semiconductor laser containing such a compound semiconductor material as a principal component. Where the Si, together with the Mg, is incorporated in the semiconductor layer, the Si gathers on the side of an interface with an adjacent layer to create an Si-rich area. It is considered that the development of defects and distortion in the interface as set out above is suppressed by the Si-rich area. This enables enhanced reliability to be achieved on the semiconductor laser with the II-VI Group compound semiconductor contained as its main constituent.

According to the present invention, if Mg is doped either as a p-type dopant into the III-V Group compound semiconductor or as a constituent element into the II-VI Group semiconductor, two kinds of gases can be used as feed gases, one being a compound gas containing the Si and the other a compound gas containing the Mg. As the compound gas containing the Si, use may be made of an Si hydride such as SiH$_4$ and Si$_2$H$_6$ as well as an organometallic Si component such as Si(CH$_3$)$_4$, while, on the other hand, as the compound gas containing the Mg use may be made of CP$_2$Mg, bis(methylcyclopentadienyl)magnesium, bis(ethylcyclopentadienyl)magnesium, etc.

The flow rate of the feed gas containing the Si can be determined in accordance with that of the feed gas containing the Mg. Since the amount of Si corresponding to that of Mg needs to be present so as to suppress the diffusion of the Mg in the III-V Group compound semiconductor layer, an amount of Si fed is selected in accordance with a desired amount of Mg. If, for example, the amount of carrier flow through $Cp_2Mg$ at 0° C. is fed as the Mg feed at a rate of 10 to 100 cc/min, then the amount of $SiH_4$ is also fed as the Si feed, preferably, at a rate of 10 to 100 cc/min with a concentration of 10 ppm.

In the manufacture of a semiconductor laser of the present invention having a predetermined compound semiconductor layer containing the Si and Mg, use may be made, as a feed gas, of a compound containing the Mg and Si. Effective as such a compound is an organic Mg compound having a bond with three methyl groups attached to an Si atom as represented by an $Me_3Si$-group.

Explanation will be given below about the organic Mg compound. The organic Mg compound contains the Mg and Si and, hence, only one kind of feed gas is required and, in addition, the following advantages are also obtained. The inventors have considered a $Cp_2Mg$ memory effect not as being an essential problem of the Mg compound but as being a problem specific to the Mg compound containing a cyclopenta ring. It is, therefore, possible to avoid the memory effect if the Mg compound free from any cyclopenta ring is used as the feed gas. However, a straight-chain type alkyl Mg compound, being normally used as a feed gas in an MOCVD process, exhibits a strong self-associative property as set out above and does not occur in single form.

The inventors have found that, of the organic Mg compounds, those given a bulkier and well-symmetrical group occur in single form and as a compound having an adequately high vapor pressure. The material $[(Me_3Si)_2N]_2Mg$ is considered as one of such compounds and can ensure an adequate vapor pressure because its melting point is 116° C. Therefore, the material $[(Me_3Si)_2N]_2Mg$ is particularly preferable as the p-type dopant and Mg material.

The following shows a structure formula 1

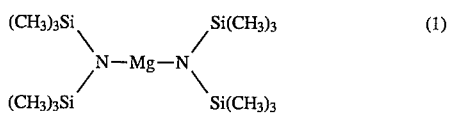
(1)

This compound exhibits a marked advantage as a doping material when Mg is doped in the III-V Group compound semiconductor containing N. It is generally considered that, if the Mg is doped in the III-V Group compound semiconductor with the N contained therein, hydrogen (H) together with the Mg is incorporated into the semiconductor. With the hydrogen mixed into a doping layer, the activation degree of the p-type dopant is lowered and it is, therefore, possible to minimize the mixing of H into the doping layer. The compound represented by the formula 1 above has a Mg-N bond in its own structure and it is possible to suppress the mixing of the H in the doped layer and hence to achieve the effective doping of the Mg. The trimethylsilyl group in the compound above is of such a type as to have three methyl groups attached to an Si atom and hence is bulkier, steric and well symmetrical. For this reason, the $Me_3Si$-group, combining with another substance, produces a stable substance.

By forming a p-type cladding layer of the III-V Group compound semiconductor by the MOCVD method with the use of such an organic Mg compound as the feed gas, the Si, together with the Mg, is incorporated in the doping layer. The Si suppresses the Mg diffusion whereby a sharp interface is created between the doped and the undoped layer.

Since the organic Mg compound has adequately high vapor pressure and no memory effect, the sharpness of the doped-to-undoped layer interface can be more enhanced and hence doping can be achieved with good reproducibility.

Further, even if the above-mentioned organic Mg compound is used as the feed upon the introduction of the Mg into the cladding layer of the II-VI Group compound semiconductor, the Si in the organic Mg compound is incorporated into the doped layer. The Si gathers on an active layer side of the cladding layer to provide an Si-rich area. This suppresses the occurrence of distortion at a cladding layer/active layer interface and of defects there.

Even with the II-VI Group compound semiconductor, like the III-V Group compound semiconductor, it is possible to achieve the composition control of the Mg with good reproducibility.

It is considered that the incorpolation of the Si into the compound semiconductor as set out above occurs even if use is made of two kinds of feed gases one containing Si and the other containing Mg.

That is, a high-reliable semiconductor laser can be obtained by incorporating the Si into a cladding layer of the p-doped III-V Group compound semiconductor layer or into a cladding layer of the Mg-containing II-VI Group compound semiconductor layer.

The present invention will be explained below by an example.

Using the material $[(Me_3Si)_2N]_2Mg$ as a feed gas, the Mg was doped into a GaN layer by virtue of an MOCVD method and measurement was made by an SIMS analytical method on a Mg concentration profile in a depth direction of the GaN layer. A result of measurement is shown in FIG. 1. For comparison, Mg was doped into a GaN layer with the use of the material $Cp_2Mg$ and then measurement was similarly made on the Mg concentration profile, the result of which is as shown in FIG. 1.

As shown in FIG. 1, when the material $Cp_2Mg$ is used as the feed gas, the Mg is not immediately incorporated into a desired layer even if the feed gas starts flowing. Further, the Mg is slowly taken into that layer even if the supply of the Mg is stopped.

When, on the other hand, the material $[(Me_3Si)_2N]_2Mg$ is used, the Mg is doped substantially at a constant rate into the doped layer while leaving a somewhat tail curve at a rise and a fall in the level of the Mg.

It is to be noted that, in the case of $[(Me_3Si)_2N]_2Mg$, the Si, together with the Mg, was incorporated into the doping layer in substantially the same amounts and that the concentration profile was sufficiently sharp.

As evident from FIG. 1, a sharp interface is created between a doped and an undoped layer by allowing the Si, together with the Mg, to be incorporated into the doped layer.

Figure 2:
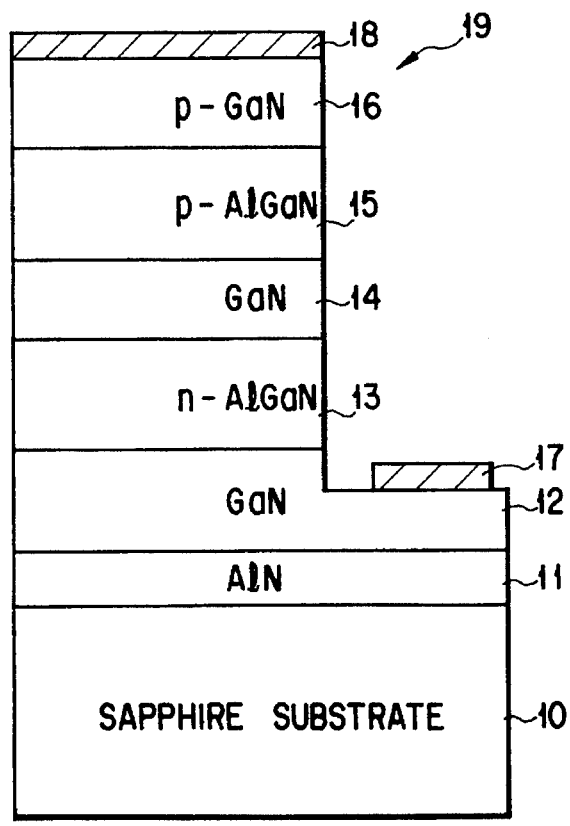
FIG. 2 is a cross-sectional view showing a semiconductor laser according to one embodiment of the present invention.

FIG. 2 is a cross-sectional view showing a semiconductor laser according to a first embodiment of the invention. A first buffer layer 11 of AlN (10 nm), a second buffer layer 12 of GaN (1.0 μm), an Si-doped n-type cladding layer 13 of AlGaN (1.0 μm), an active layer 14 of GaN (0.05 μm), an Mg-doped p-type cladding layer 15 of AlGaN (1.0 μm) and an Mg-doped p-type contact layer 16 of GaN (0.5 μm) are formed over the surface of a sapphire substrate 10 in a sequential way. Further, an Au/TiAl electrode 17 and Au/Ni electrode 18 are provided on the upper surfaces of the second buffer layer 12 and p-type contact layer 16, respectively.

FIG. 3 is a diagrammatical view showing a crystal growing apparatus using a method for carrying out the present invention. Reference numeral 21 in FIG. 3 shows a reaction tube made of quartz. A feed gas mixture is introduced via a gas supply inlet 22 into the reaction tube 21. The gas mixture in the reaction tube 21 is exhausted via a gas exhaust outlet 23. A susceptor 24 made of carbon is located in the reaction tube 21 and dielectrically heated by a high frequency coil 25. A sample substrate 20 is placed on the susceptor 24 and the temperature of the substrate 20 is measured by a thermocouple 26 and the measured temperature is controlled by another device, not shown.

A method for manufacturing a semiconductor laser of a structure as shown in FIG. 2 will be briefly explained below with the use of the growth device of FIG. 3.

First, a substrate is placed on the susceptor and, through the introduction of an $H_2$ gas into a chamber, heated to 1100° C. and the surface of the substrate is cleaned. Then the substrate temperature is dropped to 450° to 900° C., followed by the replacement of the $H_2$ gas with an N-containing organic compound, such as an $NH_3$ gas or $(CH_3)_2N_2H_2$. Together with the N-containing organic compound, an organometal compound corresponding to layers to be grown is introduced into the chamber and respective layers are grown over the substrate surface.

In the formation of semiconductor layers on the substrate, an organometal Al compound, such as $Al(CH_3)_3$ and $Al(C_2H_5)_3$, is introduced into the chamber to form a first buffer 11 containing AlN on the substrate 10. Then an organometal Ga compound, such as $Ga(CH_3)_3$ or $Ga(C_2H_5)_3$, is introduced into the chamber to form a second buffer layer 12 containing GaN.

A first cladding layer 13 containing AlGaN is grown on the surface by introducing an n-type doping feed in addition to the organometal Al compound and organometal Ga compound. As the n-type doping feed use can be made of an organometal Si compound, such as an Si hydride such as $SiH_4$ or organometal Si compound such as $Si(CH_3)_4$.

An active layer 14 is grown on the resultant surface, like the second buffer layer, by introducing the organometal Ga compound such as $Ga(CH_3)_3$ or $Ga(C_2H_5)_3$ into the chamber. It is to be noted that In may be added to the GaN active layer 14 so as to narrow a band gap in the GaN active layer 14. In this case, In can be added to the active layer by introducing an organometal In compound such as $In(CH_3)_3$ or $In(C_2H_5)_3$ at a molecular ratio of In source to Ga source in vapor phase of 5% to 100% for example.

A cladding layer 15 containing AlGaN is grown on the resultant surface by introducing a p-type doping feed in addition to the organometal Al compound and organometal Ga compound. As a p-type doping feed, use can be made of a trimethylsilyl group-containing organometal Mg compound such as $[(Me_3Si)_2N]_2Mg$, $[(Me_3Si)CH_3]_2Mg$ and $(Me_3Si)_2Mg$.

A contact layer 16 is grown on the resultant surface by introducing, into the chamber, the organometal Ga compound such as $Ga(CH_3)_3$ or $Ga(C_2H_5)_3$. As the p-type doping feed for the contact layer 16 use is made of the trimethylsilyl group-containing organic Mg compound.

In this way, the first buffer layer, second buffer layer, first cladding layer, active layer, second cladding layer and contact layer are sequentially formed over the semiconductor substrate as set out above and a resultant semiconductor structure is selectively etched to remove predetermined areas.

An Au/TiAl electrode 17 is formed by vapor deposition on the exposed surface of the second buffer layer 12 and an Au/Ni electrode 18 is by vapor deposition on the surface of the contact layer 16 to obtain a semiconductor laser 19 of the present invention as shown in FIG. 2. The semiconductor laser of such an arrangement has an oscillation wavelength of 450 nm.

Consideration is given below about the concentration of Mg and Si in the p-doped layer in the semiconductor laser of the first embodiment. It is considered that, if a 1.0 μm-thick p-doped layer is formed in accordance with the above-mentioned process step with the flow rate of the Mg feed at 0° with 50 cc/min, an amount of Mg and of Si in the p-type cladding layer is $5\times10^{19}/cm^3$ and $3\times10^{19}/cm^3$, respectively. In this case, an amount of Mg in a 0.1 μm-film thickness varies by three-orders-of-magnitude at a boundary between the p-type cladding layer and the active layer.

Even where the active layer (undoped layer) underlying the doped layer is not more than 5 nm thick, the doping amount can be controlled with adequate accuracy.

Calculation was made on the amount of Mg and of Si in the p-doped layer and variation of the Mg amount at the interface between the p-doped and the undoped layer, the results of which are shown in Table 1 below.

TABLE 1

| Sample No. | Si concentration | Mg concentration | Change in Mg concentration |
|---|---|---|---|
| 1 | $3 \times 10^{17}$ | $6 \times 10^{19}$ | 2 times |
| 2 | $3 \times 10^{17}$ | $5 \times 10^{18}$ | 5 times |
| 3 | $1 \times 10^{9}$ | $2 \times 10^{19}$ | 5 times |

As shown in Table 1, when an amount of Si in the p-doped layer is less than $5\times10^{17}/cm^3$, a variation in an Mg amount per 0.1 μm in its interface with the undoped layer is only a half. That is, it is not possible to obtain sharp doping of Mg in the p-type cladding layer.

When an amount of Mg in the p-doped layer is less than $5\times10^{18}/cm^3$, a desired resistance cannot be obtained though a diffusion length is not more than 0.1 μm. In order to maintain the characteristic of the doped layer, equal to or more than $1\times10^{19}/cm^3$ of Mg is required. If, on the other hand, Si is contained in the doped layer, the Mg is diffused to a neighboring layer, thus failing to obtain any sharp interface.

Where Si in the p-doped layer is equal to or more than $5\times10^{18/cm3}$, a variation in an amount of doped Mg at the interface with the undoped layer is three times per 0.1 μm. From this it has been found to obtain a very sharp interface. Even in this case, the resistance of the p-doped layer is not more than 1 Ω·cm, a value adequate to a semiconductor laser.

Since, according to the present embodiment, Si is incorporated into a p-type AlGaN cladding layer of DH structure, it is possible to achieve sharp doping of Mg and hence to predict a DH laser of excellent performance.

Since, in particular, the organic Mg compound having an $Me_3Si$-grou$_p$ is used as an AlGaN p-type dopant, the sharp doping of Mg can be achieved at the p-type AlGaN cladding layer of DH structure, thus making it possible to manufacture a DH laser of excellent performance.

FIG. 4 is a cross-sectional view showing a semiconductor laser according to another embodiment of the present invention. In that semiconductor laser 37, as shown in FIG. 4, a GaAs buffer layer 31, ZnMgSSe cladding layer 32, ZnSe active layer 33 and ZnMgSSe cladding layer 34 are sequentially formed over a GaAs substrate 30 with an Au electrode 36 formed on the surface of the cladding layer 34 and an AuGe electrode on the rear surface of the substrate 35.

Even in this embodiment, these layers are grown by virtue of an MOCVD method as in the case of the first embodiment and Si is incorporated into at least the Mg-containing cladding layers 32 and 34. By doing so it is possible to manufacture of a ZnMgSSe/ZnSe hetero-structure having a sharp hetero interface.

In the semiconductor laser, the development of defects and distortion are suppressed on that side of the cladding layer where the active layer side is situated. By doing so, it is possible to achieve high reliability.

The following consideration is paid to the concentration of Mg and Si in the cladding layer in the semiconductor laser of the second embodiment. It is considered that, if 1.0 μm-thick cladding layer is formed, for example, at a rate of an Mg feed flow of 100 cc/min, in accordance with the embodiment 1, an amount of Si in the cladding layer becomes $1 \times 10^{19}/cm^3$. In this case, Si is concentrated on an active layer-side of the cladding layer to provide an Si-rich area. This prevents the development of defects in the doped/undoped layer interface. In the case where the Si in the cladding layer is less than $5 \times 10^{18}/cm^3$, it is predicted that an Si-rich area is not formed near the surface of the cladding layer and hence there arise defects or distortion.

In the semiconductor laser of the second embodiment, the amount of Mg in a cladding layer-to-active layer bounary at a film thickness of 0.1 μm varies in a range of three times.

Even if the active layer neighboring the cladding layer is not more than 5 nm, that doping amount can be controlled with adequate accuracy.

Since, according to the present invention, not only the Mg but also the Si is incorporated into the ZnMgSSe cladding layer, it is predicted that the sharp concentration change of the Mg can be achieved and a DH laser of excellent performance can be obtained.

Since, in particular, the organic Mg compound having an $Me_3Si$ group is used as the Mg feed, sharp doping can be achieved at the cladding layer-to-active layer interface and, at the same time, the development of defects and distortion can be suppressed at the surface of the cladding layer and it is possible to manufacture a DH laser of excellent performance.

The present invention is not restricted to the above-mentioned respective embodiments. Although, in the embodiment, the trimethylsilyl group-containing organic Mg compound has been used as a Mg feed gas in an MOCVD process, use can be made of any $Me_3Si$ group-containing organic Mg compound.

The materials of the compound semiconductor layer as set out in connection with the embodiment are not restricted thereto and a proper modification can be made in accordance with a specification used. Various changes and modifications can be made without departing from the spirit and scope of the present invention.

According to the present invention, as set out above in more detail, a highly reliable semiconductor laser can be obtained by incorporating the Mg and Si into the p-doped III-V Group compound semiconductor or into a cladding layer containing the II-VI Group compound semiconductor.

The method of the present invention, using a $Me_3Si$-group-containing organic Mg compound as the Mg material in the MOCVD process, can ensure, with good reproducibility, the growth of a compound semiconductor layer structure excellent in the doping sharpness of an amount of Mg and in controllability of an Mg composition. It is predicted that the present method contributes much to improving the characteristic of a semiconductor laser and of a device using a compound semiconductor such as a light emitting diode.

Additional advantages and modifications will readily occur to those skilled in the art. Therefore, the invention in its broader aspects is not limited to the specific details, representative devices, and illustrated methods shown and described herein. Accordingly, various modifications may be made without departing from the spirit or scope of the general inventive concept as defined by the appended claims and their equivalents.

What is claimed is:

1. A semiconductor laser having an oscillation wavelength of not more than 450 nm, comprising:

a substrate;

a lower cladding layer formed on or over the substrate and containing a III-V Group compound semiconductor as a main component;

an active layer formed on the lower cladding layer and containing the III-V Group semiconductor as a main component; and an upper p-type cladding layer formed on the active layer and containing the III-V Group semiconductor as a main component, wherein Mg and Si are included in the upper p-type cladding layer.

2. The semiconductor laser according to claim 1, wherein the III-V Group compound semiconductor is comprised of a GaN series compound semiconductor.

3. The semiconductor laser according to claim 2, wherein the concentration of Si in the upper p-type cladding layer is not less than $5 \times 10^{18}/cm^3$.

4. The semiconductor laser according to claim 2, wherein the thickness of the active layer is not more than 5 nm.

5. The semiconductor laser according to claim 2, wherein In is contained in the active layer.

6. A method for manufacturing a semiconductor laser having an oscillation wavelength of not more than 450 nm comprising the steps of:

forming a lower cladding layer containing a III-V Group compound semiconductor as a main component on or over a substrate;

forming an active layer containing a III-V compound semiconductor as a main component on the lower cladding layer; and forming an upper p-type cladding layer containing the III-V Group compound semiconductor as a main component on the active layer, wherein, as a p-dopant source gas for the upper cladding layer, use is made of an Mg-containing feed gas and Si-containing feed gas.

7. The method according to claim 6, wherein the III-V Group compound semiconductor is comprised of GaN series compound semiconductor.

8. The method according to claim 7, wherein the active layer is not more than 5 nm thick.

* * * * *